United States Patent
Barth

(10) Patent No.: US 9,726,707 B1
(45) Date of Patent: Aug. 8, 2017

(54) CONTROLLED IMPEDANCE CHARGED DEVICE TESTER

(71) Applicant: Jon E. Barth, Boulder City, NV (US)

(72) Inventor: Jon E. Barth, Boulder City, NV (US)

(*) Notice: Subject to any disclaimer, the term of this patent is extended or adjusted under 35 U.S.C. 154(b) by 203 days.

(21) Appl. No.: 14/303,559

(22) Filed: Jun. 12, 2014

Related U.S. Application Data

(60) Provisional application No. 61/834,255, filed on Jun. 12, 2013.

(51) Int. Cl.
| | | |
|---|---|---|
| *G01R 31/26* | (2014.01) | |
| *G01R 31/12* | (2006.01) | |
| *G01R 31/28* | (2006.01) | |

(52) U.S. Cl.
CPC ......... *G01R 31/12* (2013.01); *G01R 31/2855* (2013.01)

(58) Field of Classification Search
CPC .......... G01R 1/0466; G01R 31/318536; G01R 31/318552; G01R 31/3679; H01L 41/044; G01N 15/082; G01N 33/00
USPC ......... 324/762.01, 757.04–762.06, 500, 547, 324/439, 446, 543, 691–727, 66
See application file for complete search history.

(56) References Cited

U.S. PATENT DOCUMENTS

| | | | | |
|---|---|---|---|---|
| 5,804,977 | A * | 9/1998 | Consiglio | G01R 31/002 324/676 |
| 6,429,674 | B1 | 8/2002 | Barth et al. | |
| 7,733,107 | B1 | 6/2010 | Barth et al. | |
| 2004/0264081 | A1* | 12/2004 | Maloney | G01R 31/001 361/58 |
| 2006/0278996 | A1* | 12/2006 | Trezza | H01L 21/76898 257/777 |
| 2009/0134880 | A1* | 5/2009 | Grund | G01R 31/002 324/537 |

OTHER PUBLICATIONS

"A Transmission Line Taper of Improved Design", R.W. Klopfenstein; Proceedings of the IRE Jan. 1956, pp. 31-35.

* cited by examiner

*Primary Examiner* — Melissa Koval
*Assistant Examiner* — Trung Nguyen
(74) *Attorney, Agent, or Firm* — Kenehan & Lambertsen, Ltd; John C. Lambertsen

(57) ABSTRACT

An ESD tester transforms high speed pulses from s 50-ohm impedance to the optimum lower impedance necessary to simulate the Charged Device Model ("CDM") test impedance. Direct connections to the device under test eliminates the variations in spark or contact resistance of the present test while transforming the test pulse impedances to the appropriate level. Direct device connections with controlled impedance current paths provide either internal device discharge or external test pulse testing to simulate the original test. The sparkless direct connection controlled impedance transformation is identified by its ability to simulate similar device failures at similar test voltage failure levels.

16 Claims, 5 Drawing Sheets

CONTROLLED IMPEDANCE CHARGED DEVICE TESTER

RELATED APPLICATIONS

The present application claims the benefit of priority under 35 USC §119 (e) to U.S. Provisional Application No. 61/834,255, filed on Jun. 12, 2013, which is incorporated by reference herein for all that it contains.

BACKGROUND OF THE INVENTION

Field of the Invention

The present invention relates to an apparatus for Charged Device Model (CDM) testing, which is a specific form of Electro Static Discharge (ESD) testing. More specifically, the present invention relates to a CDM tester utilizing a high speed impedance transformer to control discharge impedance and to transform impedance test pulses of the complete time domain test waveform.

Description of the Related Art

The Charged Device Model (CDM) test was devised to simulate a real world threat when an Integrated Circuit (IC) chip has acquired a charge, such as, for example, the triboelectric charge that builds up a voltage on the IC chip as the chip slides down metal chutes during normal machine handling. In the CDM test, the Device Under Test (DUT) is charged to a specific voltage that is expected to be found in the manufacturing or assembly environment.

During IC chip handling or movement, one of its many leads or pins will come in contact with a metal surface of zero charge. This causes the charge in the package and silicon chip to flow out through that one metal lead. When the charge voltage is above about 300 volts, the discharge process typically develops an air-spark discharge. At lower charge voltages, the air discharge rarely forms and a direct metal-to-metal contact provides the discharge current path.

The time for the discharge current to rise to its peak for charge voltages as low as 100 volts has been measured as being less than 30 picoseconds. It is very fast but is of very brief duration—only a few nanoseconds. These time parameters define the measurement speeds found in CDM testing.

The CDM test also has a specific parameter different from other Electrostatic Discharge (ESD) tests and real world ESD threats. The discharge resistance of low voltage discharges between metal contacts or air ionization between the contacts is the lowest of any ESD test. Simulating the real world threat to the packaged device in a test is critical to provide a reliable test.

The present Charged Device Model (CDM) test uses a one-ohm resistor in the discharge path to ground as a current-sensing resistor. It was originally designed to measure or record the discharge current waveform on a 1 GHz oscilloscope. The risetime measurement limit for this oscilloscope is about 350 picoseconds. The one-ohm resistance value was chosen to be low enough to not add significantly to the combined resistance of the device and spark resistance. The current-sensing resistor monitors the current flow out of an integrated circuit during the discharge. The current-sensing resistor provides high bandwidth response for analysis of high-speed discharge current data. Recent advances in oscilloscope bandwidth to 6 GHz increases its risetime measurement limit to about 60 picoseconds. These higher speeds have increased the waveform data information for improved ESD protection circuit design and analysis. To insure future measurement speeds of less than 30 picoseconds, test bandwidths for both measurements and test pulses ideally should be at least 10 GHz. This will insure accurate test simulations and current discharge waveform data capture information.

Diode and other ESD silicon voltage clamps are used where the connection leads, pins, or balls connect to the silicon chip, to protect the chip's operating circuits. This CDM type of ESD event can be fast enough that silicon ESD protection circuits may not turn on sufficiently fast to protect sensitive gate oxides in modern complementary metal-oxide-semiconductor ("CMOS") circuits. A 10-picosecond turn-on delay in protection operation may not clamp the early part of the ESD threat. This will allow some of the ESD voltage to not be fully clamped by the protection circuit, which can damage sensitive gate oxides in the operating part of the IC chip.

The CDM current discharge flows through the spark or metal contact to the ground return. Unfortunately, air sparks and metal-to-metal contacts have variable resistances, which cause the measured discharge current to also vary. A no-spark method of CDM testing has been sought for many years. A new Contact CDM ("CCDM") test is being considered to eliminate discharge pulse amplitude variations.

A 50-ohm CCDM tester has been proposed as a sparkless CDM test solution. The device pins to be tested are connected via a 50-ohm transmission line to a high-speed switch connected to a voltage supply to charge the assembly to specific voltage test levels. When the switch is closed, it discharges the transmission line and the DUT into a 50-ohm load or an attenuator. Test data with the 50-ohm load impedance have produced peak currents significantly lower than that of the existing CDM tester. Testing at the same voltage but increasing the peak current to match that of the CDM test will require reducing the CCDM source or load impedance until it matches the discharge impedance of the CDM test. It has been suggested that the spark resistance part of the discharge load impedance may be 25 ohms. However its true value may be even lower and is best determined by measurement.

Any new test to improve peak current repeatability must also provide the same CDM threat to the Device Under Test (DUT). If the sparkless CCDM CDM tester is to provide the same ESD threat to the DUT, its source impedance that replaces the discharge spark or contact is an important factor in providing the same peak current. The peak discharge current is determined by the combination of the device internal circuit impedance, the CDM tester's spark, or contact resistance, and the one-ohm current sensor. For the new test to replicate the CDM test and provide the same discharge current threat, its source impedance must be the same as the spark or contact impedance or resistance which it replaces.

Certain Japanese companies provide a CCDM test method using a short conductor connecting the DUT pin to be tested. The conductor and the pin are charged to the test voltage, and both are connected to a controlled atmosphere switch. This CCDM test closes the switch to discharge the short conductor and the DUT into a low resistance resistive load. This Japanese CCDM method does not control the impedance of the short conductor or the impedance of the switch in the sub nanosecond time frame. The CDM failure level data does not correlate well with this CCDM test because the high speed impedance of the discharge path is not controlled to simulate the short path CDM discharge impedance.

SUMMARY OF THE INVENTION

High speed high voltage measurement and pulse generating circuits typically are made in 50-ohm impedance. The present invention utilizes a wide bandwidth, high speed, coaxial impedance transformer to reduce the test impedance element which replaces the low impedance spark or contact impedance. The impedance transformer is located between the DUT and the 50-ohm internal discharge or external test pulse source circuit. The CDM discharge waveform lasts only a few nanoseconds, and the slow speed response of the transformer does not have to extend to more than a few nanoseconds. Impedance transformers previously used in the frequency domain at high frequencies are well-suited for use in the present high-speed current application in the time domain, to reduce the CCDM test source impedance at the DUT to match that of the CDM test spark or contact discharge impedance. This will be identified as the controlled impedance CCDM test.

An external high-speed test pulse is generated by a source having a 50-ohm impedance. The impedance is decreased by passing the pulse through the impedance transformer to decrease its source impedance to simulate the CDM discharge spark or contact impedance. The gradual impedance taper provides an impedance decrease for the high speed test pulse from the 50-ohm test pulse source to the DUT without reflections. The outer conductor of a coaxial transmission line is gradually decreased in diameter to decrease the impedance of the transmission line and supply the necessary test pulse impedance to the pin of an integrated circuit.

The gradual impedance transition design minimizes reflections over a wide bandwidth for the duration of the CDM discharge waveform time. Alternatively, the diameter of the inner conductor can be increased to provide the same change of impedance over the same length. The first configuration is slightly easier to construct. It allows the use of a constant diameter inner conductor connected to the small diameter pogo pin to contact small pin spacings on an integrated circuit. In either configuration, one of the common DUT pins is connected to ground through a resistor and switch to provide a leakage current return path.

The optimum impedance transformation ratio for controlled impedance CCDM to simulate the CDM test load impedance is not yet known. Testing a few different values of low impedance transformations can identify the load impedance that will produce the necessary peak current threat that closely simulates that of the CDM test. The impedance transformer will change the source impedance, the current ratio, and voltage ratio from input to output. Knowing the transformation ratio will allow the necessary test voltage to be applied to the DUT and accurate measurements of the DUT peak current and voltage waveforms.

It is to be understood that the invention is not limited in its application to the details of construction and the arrangement of components described hereinafter and illustrated in the drawing figures. Those skilled in the art will recognize that various modifications can be made without departing from the scope of the invention.

These and other objects, aspects, and features of the present invention will be better understood from the following description of embodiments when read in conjunction with the appended drawing figures.

BRIEF DESCRIPTION OF THE DRAWINGS

Embodiments in accordance with the present invention are described below in connection with the accompanying drawing sheets.

DETAILED DESCRIPTION OF THE PREFERRED EMBODIMENTS

Reference is now made to the drawings wherein like structures refer to like parts throughout.

Figure 1:
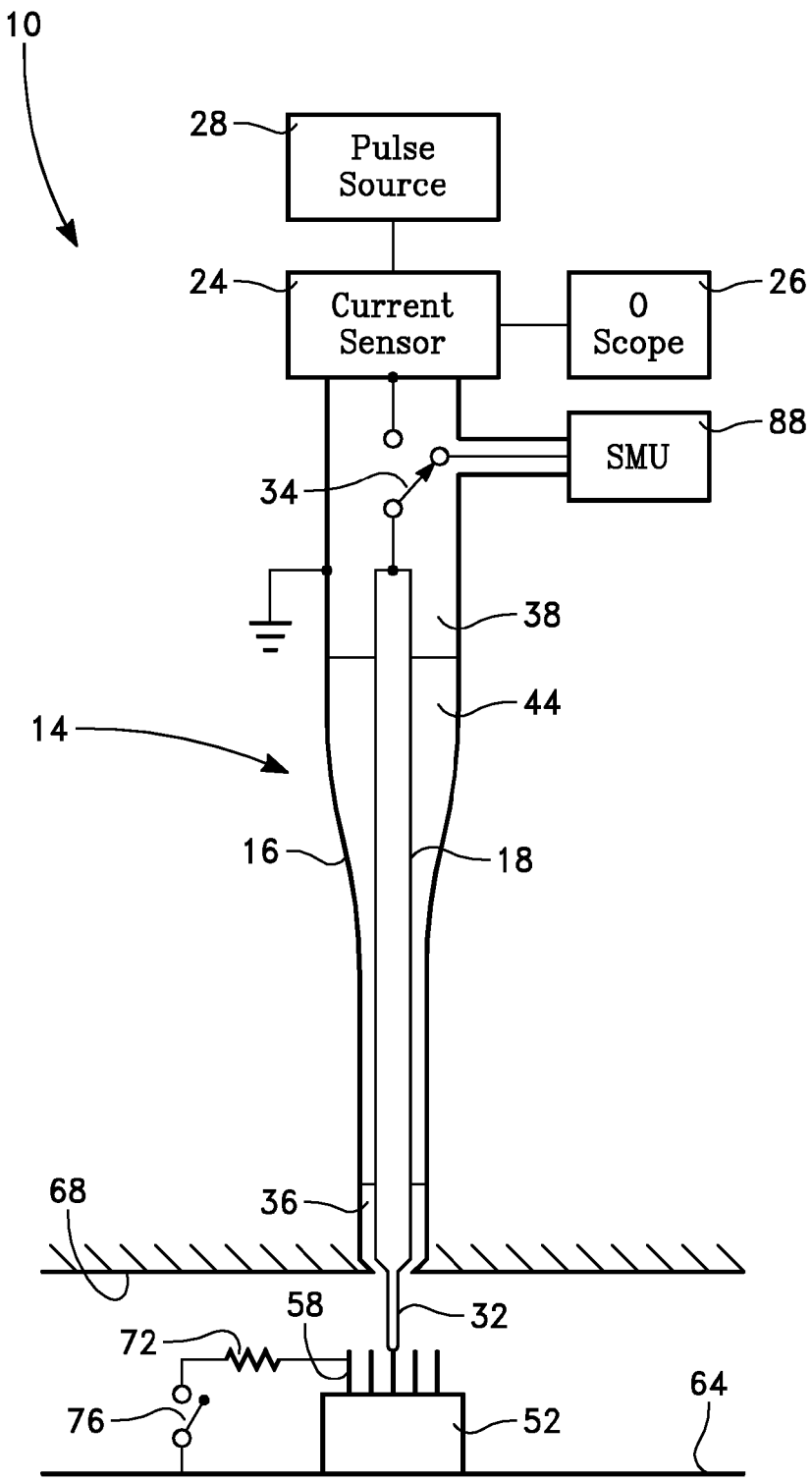
FIG. 1 is a schematic representation of a wide bandwidth, coaxial impedance transformer placed between a DUT and a fast rising short length test pulse provided by the pulse source in accordance with the present invention.

In FIG. 1, a controlled impedance Charged Device Model (CDM) tester 10 includes a transmission line impedance transformer 14 having an outer conductor 16 and an inner conductor 18. The impedance transformer 14 extends between a 50-ohm high speed coaxial switch (leakage measurement switch) 34 used to connect a DUT 52 to a test pulse source 28. Its DC continuity to the DUT 52 allows a Source Measurement Unit (SMU) 88 to apply a defined test voltage to the DUT lead after each test pulse and measure its DUT leakage current. Silicon DUT failure is identified when the leakage current increases above a limit. When the switch 34 connects the DUT to the pulse source 28 and current sensor 24, the test pulse can be applied to the DUT 52. The current sensor 24 allows the incident waveform to the DUT 52 and the reflected waveform from the DUT 52 to be monitored on an oscilloscope 26.

The transmission line impedance transformer 14 is divided into three sections: a low impedance section 36 adjacent a pogo pin 32; a 50-ohm impedance section 38 adjacent the connection to the 50-ohm leakage measurement switch 34; and a central transmission line impedance taper section 44 extending between the low impedance section 36 and 50-ohm impedance section 38. In the central taper section 44, the outer conductor 16 has a smoothly changing inside diameter, with the inner conductor 18 having a uniform diameter throughout this same central section 44. The impedance of a coaxial transmission line is determined by the ratio of the inside diameter of the outer conductor to the outside diameter of the inner conductor. This impedance transformation is accomplished by a smoothly changing outer diameter while the inner diameter remains constant. Either diameter can be changed or they both can be changed along the transformer's length to effect the necessary impedance transformation ratio.

A result of such transmission line tapering is a change in impedance over the length of taper as described, for example, in the attached appendix, "A Transmission Line Taper of Improved Design", R. W. Klopfenstein; Proceedings of the IRE January 1956, pp. 31-35. Although this design is identified for frequency domain use, it can also be used for 100-picosecond risetime pulses in the time domain lasting a few nanoseconds. The step function input from the pulse source 28 to the transformer accurately transforms the initial fast rise to the desired impedance. After the initial rise pulse amplitude transformation, the step function pulse amplitude gradually decreases over a few nanoseconds required for this test pulse. This type of impedance transformer produces the fast rise followed by an exponential decay is well suited to simulate the CDM type waveform. To simulate the CDM decaying waveform the transformer length must be about three times electrically longer than the capacitively decaying current electrical time in the CDM test. A 24-inch long transformer will provide the required waveform decay time.

As is shown in FIG. 1, the DUT 52 is held down to a metal ground plane 64, with an isolated ground plane 68 placed above the DUT 52. A low capacitance resistor 72 is connected to a different one of the plurality of the pins 58 than the pin being tested (such as a ground or $V_{dd}$ or $V_{ss}$ pin) with the contacts of a low capacitance, single-pole, single-throw relay 76 providing a ground return path during the leakage test. Upon completion of the controlled impedance CCDM testing of each of the plurality of pins 58, a separate leakage test may occur with the SMU 88 while the pogo pin 32 remains connected to the tested pins on the Integrated Circuit (IC) DUT 52. A Source Measurement Unit (SMU) 88 measures leakage current and is utilized to identify increased leakage current of the silicon chip in the DUT 52.

Figure 2:
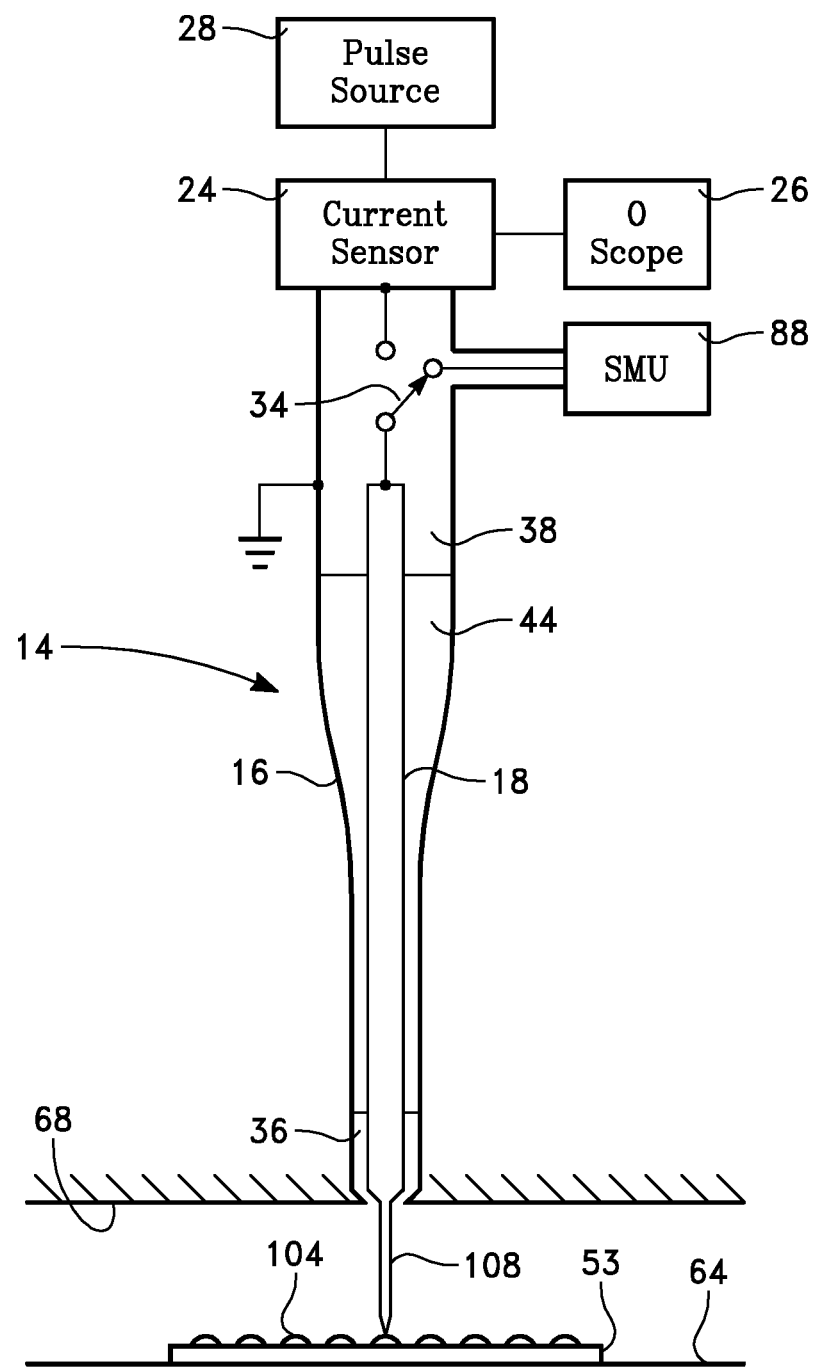
FIG. 2 is a schematic representation of sharp point needle received by a solder ball of a Ball Grid Array (BGA) packaged integrated circuit. BGA packages are replacing the Dual Inline Packages (DIP) that use solderable metal leads that extend from the IC package.

In FIG. 2 the DUT is a Ball Grid Array (BGA) package 53, which is held down to the metal ground plane 64. A plurality of balls 104 arranged in an array replaces the plurality of perimeter pins 58 depicted in FIG. 1. A sharp point needle 108 is pushed into one of the plurality of solder balls 104 to insure a low-resistance connection. As is also shown in FIG. 2, the same impedance transformer 14 as is depicted in FIG. 1 is used to provide the necessary low impedance to the fast rising controlled impedance CCDM current pulse.

A tapered impedance transformer of approximately 24-inch length for this sparkless CDM test operates well from about 500 MHz to beyond 10 GHz. Its physical length can be decreased by filling the impedance transformer with any of the low loss dielectric materials available in the microwave industry. Emerson & Cuming Microwave Products provides a series of low loss dielectric materials for this purpose.

In reducing the test pulse impedance with an impedance transformer, the current is increased and the voltage is decreased by the square root of the impedance ratio. Therefore in the CDM test, if a specific discharge peak current is achieved with a charge voltage of 100 volts, then the device must be charged to 100 volts. The DUT current waveform passing through the tapered transmission line 44 will be decreased when it arrives at the 50-ohm impedance measurement system.

With the necessary impedance ratio, the peak current after being transformed from the low DUT impedance value to the 50-ohm impedance the measured current must be divided by the square root of the impedance reduction ratio between the 50 ohm measurement impedance and the lower DUT test impedance. For example, if the necessary impedance transformation ratio is 4 to 1 (50-ohm input impedance to 12.5-ohm source resistance at the DUT), then the current will be decreased by a factor of 2 at the 50-ohm current sensor. Identifying the necessary impedance transformation ratio will require DUT voltage and current waveform measurements with a selection of impedance transformation ratios to achieve the same test pulse peak current and width.

Figure 3:
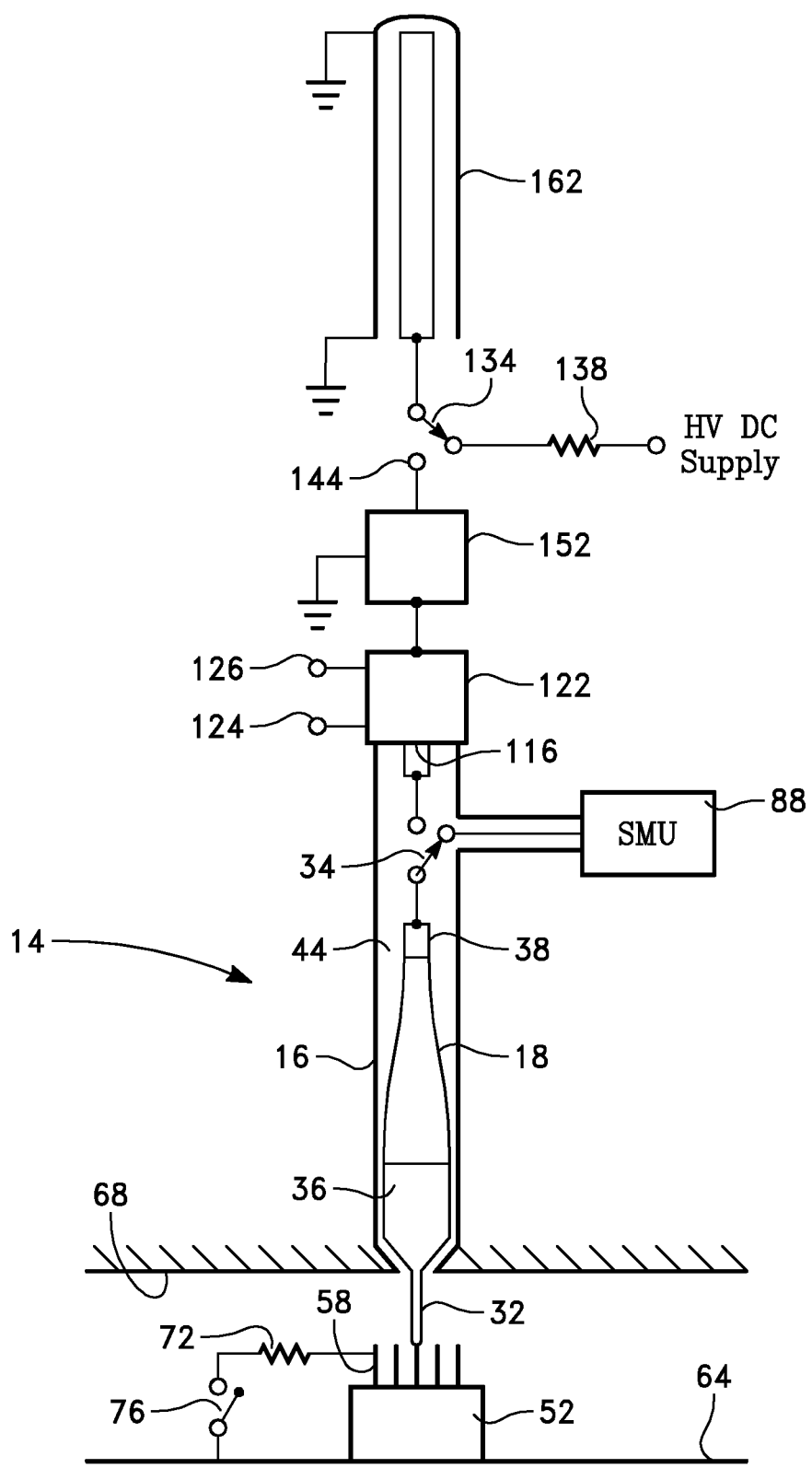
FIG. 3 is a schematic representation of a wide bandwidth, coaxial impedance transformer of alternative design placed between a DUT and a 50-ohm discharge circuit in accordance with the present invention. This impedance transformation is accomplished by a gradual change in the diameter of the inner conductor while the outer conductor remains a uniform diameter.

As is shown in FIG. 3, the test method uses a similar type of wide bandwidth coaxial impedance transformer which applies a test pulse created by discharging a transmission line 162 through a high speed controlled atmosphere switch 134 when connected to terminal 144. The charge line 162 is charged through the resistor 138 when the switch 134 is connected to the HV DC supply. A presently preferred controlled atmosphere coaxial style switch uses nitrogen gas at 150 PSI to hold off the DC charge voltage to 1000 volts. The high pressure nitrogen gas prevents a discharge from forming between the closing contacts until they are about 0.012 inches apart. The short spark breakdown also allows the electrical discharge to rise very quickly.

This test pulse is generated the same manner as the Very Fast Transmission Line (VFTLP) tester which operates similar to U.S. Pat. No. 6,429,674 that uses TLP testing to evaluate Electrostatic Discharge (ESD) circuits that protect integrated circuits from the Human Body Model (HBM) threat. TLP testing uses 100-nanosecond long test pulses. However the VFTLP tester uses a much shorter pulse of 1-nanosecond to 10-nanosecond length. Therefore the coaxial connections are shorter, and much faster current and voltage sensors are required.

The incident test pulse from the pulse generator is measured as it passes the current and voltage monitors on its way to the DUT. Depending on the DUT impedance, some of the test voltage and current are reflected back to the source and are again measured by the voltage and current monitors. The reflected current and voltage are subtracted from the incident voltage and current to provide the DUT current and voltage information during the time the test pulse is applied to the DUT.

The pulse is applied to a transformer input port 116 (FIG. 3) to exercise the DUT 52 by first passing the pulse through the impedance transformer 14. The coaxial impedance transformer of FIG. 3 is shown having the outer conductor 16 of a uniform outer diameter and the inner conductor 18 of a smoothly changing diameter and impedance.

The impedance transformer 14 may also have the outside diameter of the inner conductor and inside diameter of the outer conductor both change smoothly to provide the required impedance transformation. The impedance transformation versus length requirement is identified in Klopfenstein or as modified in more recent technical publications.

The impedance transformer embodiment with both conductor diameters changing is not shown in the figures. Further, it is to be understood and appreciated that any coaxial impedance transformation method, linear, exponential or other can be used to still accomplish the necessary impedance transformation and achieve a reasonable correlation between the controlled impedance CCDM test and the CDM test. As is shown under the present invention, a coaxial impedance transformer about 24 inches in length transforms the 50-ohm pulse source impedance to the lower impedance value required to simulate the CDM spark or contact impedance.

A preferred construction of a 50-ohm to 15-ohm impedance transformer for example will use an inner conductor of thick silver plated brass uniform diameter rod of about 0.200 inch diameter of about 24 inches length. The outer conductor is made from two pieces of aluminum of about 0.5 inch thick by 1.0 inch wide and 24 inches long. A computer controlled milling machine cuts a semicircular radius into each piece along its length. The 50-ohm impedance end begins at about 0.460 inch diameter. The ideal Klopfenstein continuous contour is then cut along the 24-inch length to create a taper that ends at a diameter of about 0.257 inch, forming the 15-ohm impedance end. Silver plating the aluminum body of the coaxial impedance transformer, will also keep high speed test pulse losses to their minimum.

The two halves of the 24-inch long aluminum body are then bolted together forming a long variable diameter cavity. The 24-inch long constant diameter silver plated inner conductor is placed inside the cavity to form the coaxial transmission line transformer. One end is connected to the inner conductor of a coaxial connector, the flange of which is mounted to the larger inside diameter end of the split aluminum body. The other end of the 24-inch long constant diameter inner conductor has a hole in it to accept the body of the pogo pin. This end forms 15-ohm impedance end, which will connect to the integrated circuit pins.

A coaxial current and voltage monitor 122 with a current port 124 and a voltage port 126 will provide measurement of the incident test pulse and that reflected from the DUT 52. The Barth Electronics (www.barthelectronics.com) model CV1 having combined high speed current and voltage sensors provides this measurement in the Barth Model 4012 VFTLP+ system and can provide similar measurements in the CCDM system described here.

In a presently preferred embodiment, the test pulse is generated by a test pulse switch 134 moving from a charge position connected to a DC charge resistor 138 to a discharge position 144 connected to a reverse match attenuator 152. The attenuator provides a method to adjust the test pulse voltage amplitude and also provides a reverse match circuit to substantially reduce re-reflections from the pulse generating transmission line 162. The incident test pulse initially flows through the attenuator 152, the current and voltage monitor 122, the high speed coaxial leakage measurement switch 34 and then into the 50-ohm impedance section 38 of the impedance transformer 14. The pulse travels through the central transmission line taper section 44 and into the low impedance section 36, which connects the pulse to the DUT 52 on one of the test device pins 58, though the pogo pin 32.

Figure 4:
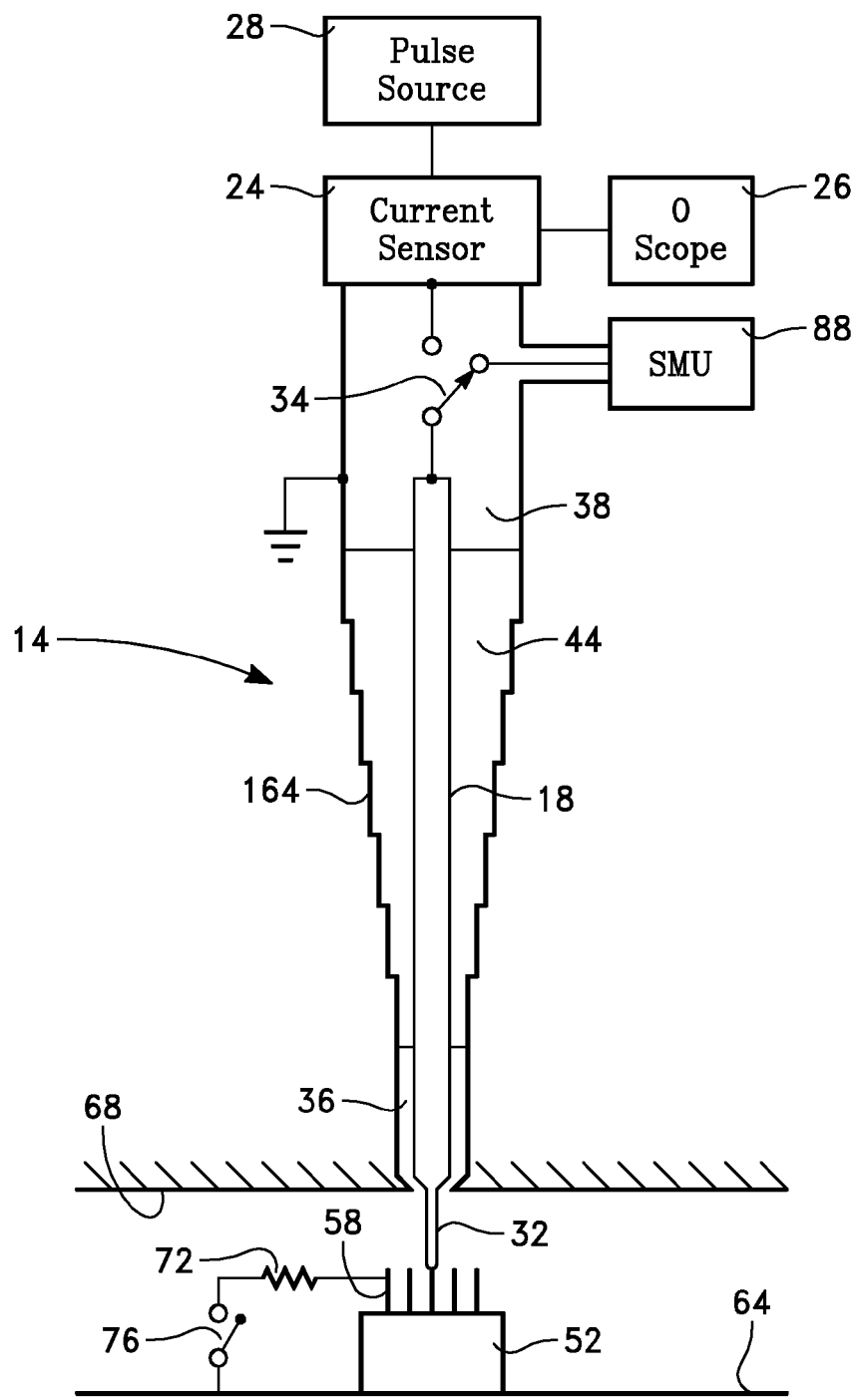
FIG. 4 is a schematic representation, similar to FIGS. 1 and 3, showing a stepped impedance transmission line transformer.

In FIG. 4, the impedance transformer 14 is provided a stepped outer conductor 164, with steps in impedance transformation rather than with a smooth transition from high to low impedance. This method has a manufacturing advantage in being able to produce specific diameters with specific lengths rather than the continuous taper which is more complex to manufacture and measure. As with the continuous or smooth taper inner or outer conductor diameters the stepped conductors can be on the inner conductor, the outer conductor or cut into both. The tapered impedance transformer can also be constructed in any of the additional types of microwave transmission line constructions. These include but are not limited to microstrip, stripline, and co-planar wave guide, where only the foil conductor dimensions are tapered to achieve impedance transformation.

Figure 5:
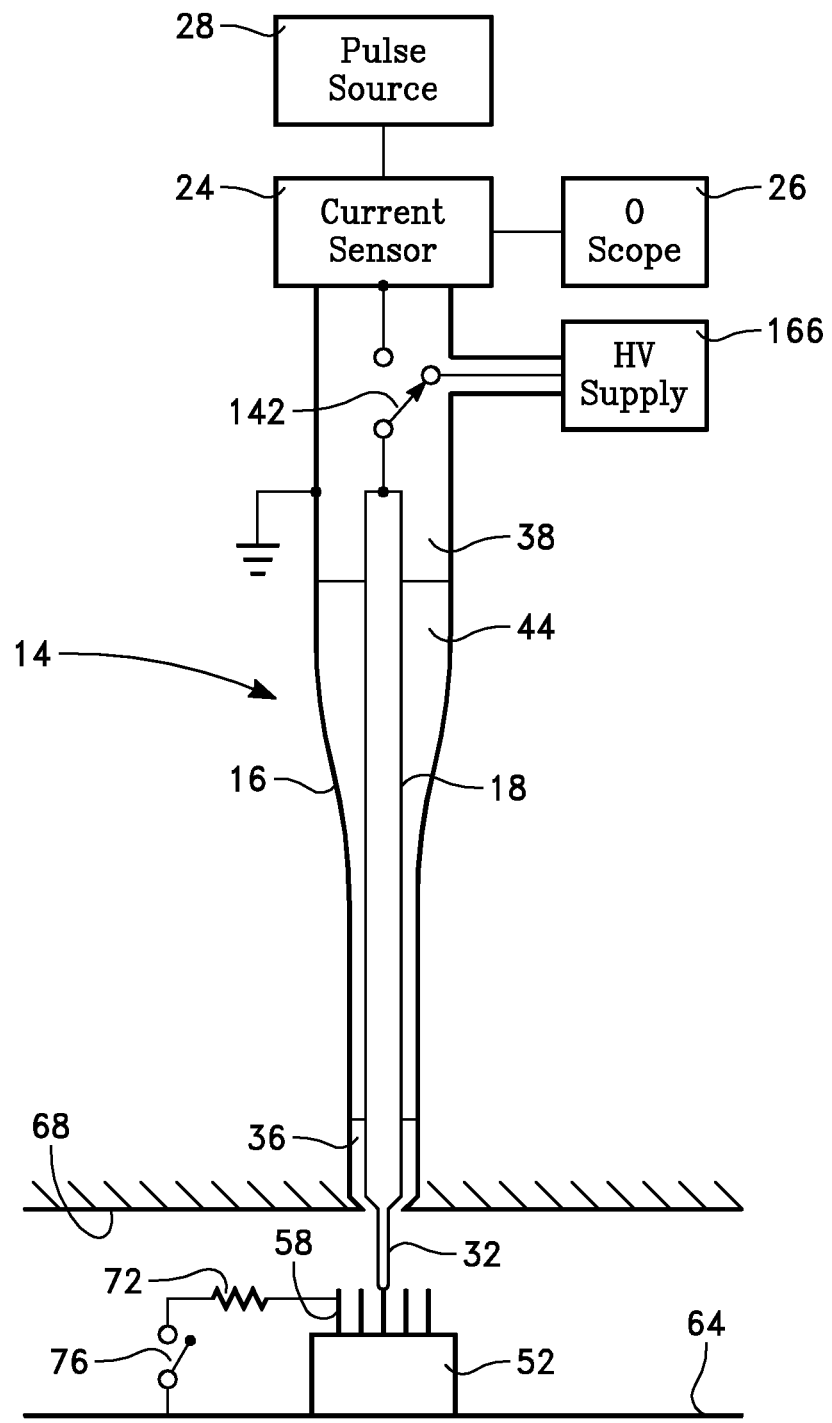
FIG. 5 is a schematic representation of charging the DUT and the transformer through a high voltage supply which is then discharged through a high speed coaxial switch into a current monitor and terminator to measure the discharge waveform.

In FIG. 5, one type of controlled impedance CCDM (Contact Charged Device Model), charge voltage is applied by a high voltage DC supply 166 to the Device Under Test (DUT) 52 though the pogo pin 32 and the inner conductor 18 of the impedance transformer 14. The charged items are then discharged through the 50-ohm high speed coaxial switch 142, which is connected to the current sensor 24 to monitor the discharge waveform on the oscilloscope 26. Using the impedance transformer 14 between the DUT 52 and the controlled atmosphere switch 142 provides a high speed discharge of the DUT 52 in the controlled impedance CCDM test. A controlled impedance CCDM test without air discharge variations in the peak current will more precisely identify the maximum test voltage that will not damage gate oxides or the silicon voltage clamp in the ESD protection circuit.

Calibration of the test circuit for accurate measurements is made by replacing the packaged silicon chip DUT 52 with a short circuit. The reflected current and voltage of the calibration pulse are measured by the current and voltage monitor 122, 124, 126 (see FIG. 3) to provide a known low resistance reference produced by the package alone. Subtracting reflected current and or voltage waveform from the incident provides the DUT voltage and current waveforms.

The Very Fast Transmission Line Pulse (VFTLP) test system is the basic test instrument whose test data will be greatly improved using the impedance transformers described here. The Voltage waveform measured with the coaxial voltage monitor 124 will provide the resulting IVI (Initial Voltage Impulse) waveform parameters created in the silicon when discharging the DUT into the low impedance with which the DUT actually operates during a CDM event. It will allow a more accurate measurement of the amplitude and width of the Initial Voltage Impulse (IVI) of the silicon voltage clamp as measured in a packaged device.

The VFTLP 50-ohm impedance rectangular test pulse is generated by a pulse circuit of the type described in Barth et al., U.S. Pat. No. 6,429,674. The charged transmission line cable 162 produces a 50-ohm very fast pulse. Measuring the DUT at the low impedance found in the CDM test will provide more accurate data from this high speed event than is possible with 50-ohm system measurements.

The impedance transformer can be used with test systems having configurations that differ from the pogo pin and sharp point needle of FIGS. 1-3. For example, Barth et al., U.S. Pat. No. 7,733,107, provides a test apparatus that minimizes parasitic inductance errors by locating the transmission line physically close to the DUT pin or contact. The present invention contemplates the application of the transformed impedance test pulse to the pin being tested utilizing the test apparatus taught in the '107 Barth et al. patent. Use of the present invention is an improvement to the test method described in the '107 Barth et al. patent by pulse testing a device with the same load/source impedance as occurs in both real world and the "spark discharge" CDM test.

This test method will identify the DUT's failure level by increasing the generated test pulse amplitude applied to the DUT until failure occurs. The leakage current after pulse testing can be monitored with the SMU 88 using the switch 34 when the single-pole, single-throw switch 76 is closed to provide a current return path though the DUT.

The Source Measurement Unit ("SMU") 88 supplies a test voltage to the DUT and measures the leakage current when one of the pins is connected to ground through the low capacitor resistor 72 via the switch (relay) 76. The ground connection can be switched through the low capacitance relay 76 and a resistor of about 10,000 ohms. The resistor and switch (relay) add isolation during the high speed test so as to not affect the CDM discharge current.

Each of the described test methods provides the transformed impedance to the DUT necessary to simulate the load impedance of both real world and the "spark discharge" CDM test.

Use of the impedance transformer in the above examples will cause the high speed voltage at either end of the impedance transformer to be determined by the voltage transformation ratio as explained above. When the high speed pulse voltage is deceased at the low impedance end of the transformer, the current is increased by the same amount.

The foregoing description refers to U.S. Pat. Nos. 6,429, 674 and 7,733,107, which are incorporated herein by reference. The description also refers to "A Transmission Line Taper of Improved Design", R. W. Klopfenstein; Proceedings of the IRE January 1956, pp. 31-35, which is attached hereto as an appendix, and which is incorporated by reference herein.

As various changes could be made in the above constructions without departing from the scope of the invention, it is intended that all the matter contained in the above description or shown in the accompanying drawings shall be interpreted as illustrative and not in a limiting sense.

What is claimed is:

1. A charged device model (CDM) testing apparatus for electrostatic discharge (ESD) testing, comprising:
    a pulse source that provides a test pulse at an output, the output having a first impedance;
    a test probe engageable with a device under test (DUT), the test probe sized to engage a first selectable contact of the DUT, the first selectable contact of the DUT having a second impedance less than the first impedance; and
    an impedance transformer having a first end portion connected to the pulse source, having a second end portion connected to the test probe, and having a central portion between the first end portion and the second end portion, the first end portion having an impedance approximately the same as the first impedance, the second end portion having an impedance approximately the same as the second impedance, the central portion having an impedance that gradually transitions from the impedance of the first end portion to the impedance of the second end portion, wherein the impedance transformer comprises an outer conductor having an inside diameter and an inner conductor having an outside diameter, at least one of the inside diameter of the outer conductor and the outside diameter of the inner conductor varying in the central portion of the impedance transformer.

2. The testing apparatus as defined in claim 1, wherein the inside diameter of the outer conductor varies, and the outside diameter of the inner conductor is constant.

3. The testing apparatus as defined in claim 1, wherein the outside diameter of the inner conductor varies, and the inside diameter of the outer conductor is constant.

4. The testing apparatus as defined in claim 1, wherein the inside diameter of the outer conductor and the outside diameter of the inner conductor both vary.

5. The testing apparatus as defined in claim 1, wherein the at least one of the inside diameter of the outer conductor and the inside diameter of the outer conductor varies uniformly in the central portion of the impedance transformer.

6. The testing apparatus as defined in claim 5, wherein the at least one of the inside diameter of the outer conductor and the inside diameter of the outer conductor varies linearly in the central portion of the impedance transformer.

7. The testing apparatus as defined in claim 1, wherein the at least one of the inside diameter of the outer conductor and the inside diameter of the outer conductor varies stepwise in the central portion of the impedance transformer.

8. The testing apparatus as defined in claim 1, wherein a volume between the outer conductor and the inner conductor is filled with a low-loss dielectric material.

9. The testing apparatus as defined in claim 1, wherein the first selectable contact of the DUT is a peripheral pin of the DUT.

10. The testing apparatus as defined in claim 1, wherein the first selectable contact of the DUT is a ball contact in a ball grid contact array of the DUT.

11. A charged device model (CDM) testing apparatus for electrostatic discharge (ESD) testing, comprising:
    a pulse source that provides a test pulse at an output, the output having a first impedance;
    a test probe engageable with a device under test (DUT), the test probe sized to engage a first selectable contact of the DUT, the first selectable contact of the DUT having a second impedance less than the first impedance;
    an impedance transformer having a first end portion connected to the pulse source, having a second end portion connected to the test probe, and having a central portion between the first end portion and the second end portion, the first end portion having an impedance approximately the same as the first impedance, the second end portion having an impedance approximately the same as the second impedance, the central portion having an impedance that varies from the impedance of the first end portion to the impedance of the second end portion; and
    a leakage test circuit connectable to a second selectable contact of the DUT, the leakage test circuit comprising a DC voltage source, a current measurement device, a switch, and a resistor, the switch selectably closeable to interconnect the second selectable contact of the DUT to a ground reference via the resistor, the DC voltage source applying a voltage to the first selectable contact of the DUT via the inner conductor of the impedance transformer, the current measurement device measuring the current that flows to the ground reference from the second selectable contact of the DUT.

12. A method for electrostatic discharge testing of a device under test (DUT), the method comprising:
    applying a high voltage pulse from a voltage source to a first end of an impedance transformer, the first end of the impedance transformer having an impedance approximately the same as an impedance of the voltage source;
    coupling the high voltage pulse from the first end of the impedance transformer to a second end of the impedance transformer, the second end of the impedance transformer having a second impedance lower than the first impedance, the second impedance being approximately the same as an impedance of a first selected contact of a DUT, the impedance of the impedance transformer varying uniformly between the first end and the second end of the impedance transformer the second end of the impedance transformer connected to the first selected contact of the DUT via a probe;
    sensing an incident voltage and an incident current at the first end of the impedance transformer caused by the high voltage pulse applied to the impedance transformer and sensing a reflected voltage and a reflected current from the first selected contact of the DUT; and
    subtracting the reflected voltage and the reflected current from the incident voltage and the incident current, respectively, to determine a DUT voltage and a DUT current caused by the test pulse.

13. A method for electrostatic discharge testing of a device under test (DUT), the method comprising:

applying a high voltage pulse from a voltage source to a first end of an impedance transformer, the first end of the impedance transformer having an impedance approximately the same as an impedance of the voltage source;

coupling the high voltage pulse from the first end of the impedance transformer to a second end of the impedance transformer, the second end of the impedance transformer having a second impedance lower than the first impedance, the second impedance being approximately the same as an impedance of a first selected contact of a DUT, the impedance of the impedance transformer varying uniformly between the first end and the second end of the impedance transformer the second end of the impedance transformer connected to the first selected contact of the DUT via a probe;

sensing an incident voltage and an incident current at the first end of the impedance transformer caused by the high voltage pulse applied to the impedance transformer and sensing a reflected voltage and a reflected current from the first selected contact of the DUT;

subtracting the reflected voltage and the reflected current from the incident voltage and the incident current, respectively, to determine a DUT voltage and a DUT current caused by the test pulse;

after termination of the test pulse, electrically connecting a second selected contact of the DUT to a ground reference through a resistor;

applying a DC voltage to the first selected contact via the inner conductor of the impedance transformer; and measuring a leakage current to the ground reference to determine whether the leakage current increases in response to the test pulse.

14. A method for electrostatic discharge testing of a device under test (DUT), the method comprising:

connecting a probe to a first selected contact of a DUT, the probe connected to a first end of an impedance transformer, the impedance transformer having a first impedance at the first end, the first impedance being approximately the same as an impedance of the first selected contact of the DUT, the impedance transformer having a second end, the second end having a second impedance that is greater than the first impedance, the impedance of the impedance transformer varying uniformly between the first end and the second end of the impedance transformer;

selectively applying a high voltage from a voltage source to the second end of the impedance transformer via a switch, the high voltage coupled through the impedance transformer to charge the DUT via the first selected contact; and after charging the DUT with the high voltage, operating the switch to disconnect the second end of the impedance transformer from the voltage source and to connect the second end of the impedance transformer to a current sensor, the current sensor having an impedance approximately the same as the second impedance of the impedance transformer, the connection of the second end of the impedance transformer discharging the DUT via the current sensor, the current sensor monitoring a discharge current from the DUT to enable evaluation of a waveform of the discharge current.

15. The method as defined in claim 14, wherein the switch is a controlled atmosphere switch having a pressurized gas surrounding contacts of the switch to suppress electrical discharge within the switch.

16. A method for electrostatic discharge testing of a device under test (DUT), the method comprising:

connecting a probe to a first selected contact of a DUT, the probe connected to a first end of an impedance transformer, the impedance transformer having a first impedance at the first end, the first impedance being approximately the same as an impedance of the first selected contact of the DUT, the impedance transformer having a second end, the second end having a second impedance that is greater than the first impedance, the impedance of the impedance transformer varying uniformly between the first end and the second end of the impedance transformer;

selectively applying a high voltage from a voltage source to the second end of the impedance transformer via a switch, the high voltage coupled through the impedance transformer to charge the DUT via the first selected contact;

after charging the DUT with the high voltage, operating the switch to disconnect the second end of the impedance transformer from the voltage source and to connect the second end of the impedance transformer to a current sensor, the current sensor having an impedance approximately the same as the second impedance of the impedance transformer, the connection of the second end of the impedance transformer discharging the DUT via the current sensor, the current sensor monitoring a discharge current from the DUT to enable evaluation of a waveform of the discharge current;

after discharging the DUT, electrically connecting a second selected contact of the DUT to a ground reference through a resistor;

applying a DC voltage to the first selected contact via the inner conductor of the impedance transformer; and measuring a leakage current to the ground reference to determine whether the leakage current increases in response to the test pulse.

* * * * *